(12) United States Patent
Amada et al.

(10) Patent No.: US 11,626,524 B2
(45) Date of Patent: Apr. 11, 2023

(54) METHOD FOR MANUFACTURING PHOTOEXCITABLE MATERIAL

(71) Applicant: FUJITSU LIMITED, Kawasaki (JP)

(72) Inventors: Hideyuki Amada, Atsugi (JP); Fumiaki Kumasaka, Atsugi (JP); Toshio Manabe, Atsugi (JP); Toshihisa Anazawa, Sagamihara (JP); Yoshihiko Imanaka, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 971 days.

(21) Appl. No.: 16/437,063

(22) Filed: Jun. 11, 2019

(65) Prior Publication Data

US 2019/0296165 A1 Sep. 26, 2019

Related U.S. Application Data

(62) Division of application No. 15/581,607, filed on Apr. 28, 2017, now abandoned.

(30) Foreign Application Priority Data

May 31, 2016 (JP) .................................. 2016-108760

(51) Int. Cl.
*H01L 31/0224* (2006.01)
*C25B 1/00* (2021.01)
(Continued)

(52) U.S. Cl.
CPC ........ *H01L 31/022483* (2013.01); *C25B 1/00* (2013.01); *C25B 1/55* (2021.01); *C25B 3/23* (2021.01); *C25B 11/091* (2021.01); *H01L 21/67207* (2013.01); *H01L 31/032* (2013.01); *H01L 31/1864* (2013.01)

(58) Field of Classification Search
CPC ........... H01L 31/022483; H01L 31/032; H01L 31/1864; H01L 21/67207; C25B 1/00; C25B 1/55; C25B 3/23; C25B 11/091
See application file for complete search history.

(56) References Cited

U.S. PATENT DOCUMENTS

| | | | |
|---|---|---|---|
| 2013/0315787 A1 | 11/2013 | Dukovic | |
| 2014/0238847 A1* | 8/2014 | Lee | ........................ C25B 1/55 204/292 |

(Continued)

FOREIGN PATENT DOCUMENTS

| | | |
|---|---|---|
| JP | 2005-144210 | 6/2005 |
| JP | 2006-104042 | 4/2006 |

(Continued)

OTHER PUBLICATIONS

Hashiguchi et al., "Photoresponse of GaN:ZnO Electrode on FTO under Visible Light Irradiation", The Chemical Society of Japan, Bull. Chem. Soc. Jpn., vol. 82, No. 3, pp. 401-407, 2009 (7 pages).

(Continued)

*Primary Examiner* — Nilufa Rahim
(74) *Attorney, Agent, or Firm* — Fujitsu Patent Center

(57) ABSTRACT

A photoexcitable material includes: a solid solution of MN (where M is at least one of gallium, aluminum and indium) and ZnO, wherein the photoexcitable material includes 30 to 70 mol % ZnO and has a band gap energy of 2.20 eV or less.

5 Claims, 3 Drawing Sheets

(51) Int. Cl.
  *H01L 31/032* (2006.01)
  *C25B 1/55* (2021.01)
  *C25B 3/23* (2021.01)
  *C25B 11/091* (2021.01)
  *H01L 21/67* (2006.01)
  *H01L 31/18* (2006.01)

(56) References Cited

U.S. PATENT DOCUMENTS

2017/0073530 A1\* 3/2017 Jin .................... C01G 49/0072
2017/0314147 A1\* 11/2017 Imanaka ................ H01G 9/204

FOREIGN PATENT DOCUMENTS

JP   2006-116415      5/2006
JP   2012-187520      10/2012
KR   20160042151 A \*  4/2016 ............... C08K 9/00

OTHER PUBLICATIONS

Jensen et al., "First-Principles Studies of the Structural and Electronic Properties of the (Ga1—xZnx)(N1—xOx) Solid Solution Photocatalyst", J. Phys. Chem. C, 112, pp. 3439-3446, 2008 (8 pages).

Imanaka et al., "Dielectric and Insulating Properties of Embedded Capacitor for Flexible Electronics Prepared by Aerosol-Type Nanoparticle Deposition", Jpn. Journal of Applied Physics 52, 05DA02, pp. 1-5, 2013 (6 pages).

Imanaka et al., "Nanoparticulated Dense and Stress-Free Ceramic Thick Film for Material Integration", Advanced Engineering Materials, 15, No. 11, pp. 1129-1135, 2013 (7 pages).

Imanaka et al., "Nanoparticulate BaTiO3 film produced by aerosol-type nanoparticle deposition", J. Nanopart. Res., 18:102, Research Paper, pp. 1-9, 2016 (9 pages).

Shet et al. ("Photoelectrochemical behavior of mixed ZnO and GaN (ZnO:GaN) thin films prepared by sputtering technique", Applied Surface Science, 270 (2013) 718-721) (Year: 2013).

Benck et al. ("Substrate Selection for Fundamental Studies of Electrocatalysts and Photoelectrodes: Inert Potential Windows in Acidic, Neutral, and Basic Electrolyte", PLoS One, 2014,9(10), pp. 1-13) (Year: 2014).

USPTO, (Keeling) Non-Final Rejection, dated Mar. 13, 2019, in parent (section 120 priority) U.S. Appl. No. 15/581,607 [pending].

USPTO, (Keeling) Restriction Requirement, dated Dec. 12, 2018, in parent (section 120 priority) U.S. Appl. No. 15/581,607 [pending].

\* cited by examiner

METHOD FOR MANUFACTURING PHOTOEXCITABLE MATERIAL

CROSS-REFERENCE TO RELATED APPLICATION

This application is a divisional of application Ser. No. 15/581,607, filed Apr. 28, 2017, which is based upon and claims the benefit of priority of the prior Japanese Patent Application No. 2016-108760, filed on May 31, 2016, the entire contents of which are incorporated herein by reference.

FIELD

The embodiments discussed herein are related to photoexcitable materials, photochemical electrodes, and methods for manufacturing photoexcitable materials.

BACKGROUND

Technologies that utilize solar energy include artificial photosynthesis and photocatalysis.

Examples of the related art are disclosed in Japanese Laid-open Patent Publication Nos. 2005-144210, 2006-116415, and 2012-187520; Hashiguchi, H. et al., "Photoresponse of GaN:ZnO Electrode on FTO under Visible Light Irradiation", *Bull. Chem. Soc. Jpn.*, 82, 401-407 (2009); and Jensen, L. L., Muckerman, J. T. & Newton, M. D., "First-Principles Studies of the Structural and Electronic Properties of the $(Ga_{1-x}Zn_x)(N_{1-x}O_x)$ Solid Solution Photocatalyst", *J. Phys. Chem. C*, 112, 3439-3446 (2008).

SUMMARY

According to an aspect of the embodiments, a photoexcitable material includes: a solid solution of MN (where M is at least one of gallium, aluminum and indium) and ZnO, wherein the photoexcitable material includes 30 to 70 mol % ZnO and has a band gap energy of 2.20 eV or less.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
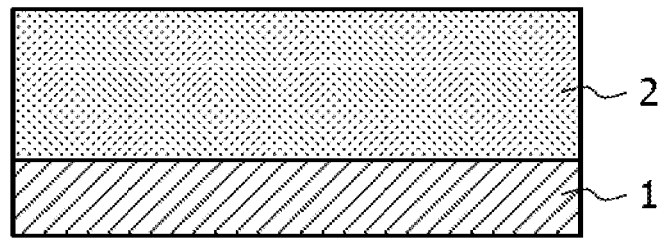
FIG. 1 is an example sectional view of a photochemical electrode.

As an example, artificial photosynthesis produces hydrogen gas from water and synthesizes an organic substance from water and carbon dioxide gas. As another example, photocatalysis decomposes contaminants. For example, these technologies use photoexcitable materials.

Photoexcitable materials are semiconductors, which have a forbidden band between the valence band and the conduction band. Photoexcitable materials absorb sunlight to excite electrons from the valence band to the conduction band, leaving holes in the valence band. The resulting excited electrons and holes reduce or oxidize water or contaminants. To enhance the utilization of solar energy, a photoexcitable material may be provided that absorbs the solar spectrum from short wavelengths to as long a wavelength as possible. To provide such a photoexcitable material, a narrower forbidden band is desirable.

Gallium nitride (GaN) and zinc oxide (ZnO) are UV-responsive photoexcitable materials having forbidden band widths of about 3.1 eV and about 3.2 eV, respectively. GaN and ZnO both have a Wurtzite-type crystal structure and are mixed in any ratio to form a $Ga_xN_xZn_{1-x}O_{1-x}$ solid solution having the same structure.

For example, the band gap energy of $Ga_{1-x}N_{1-x}Zn_xO_x$ solid solutions containing 30% or less ZnO that are synthesized by solid-state reactions decreases with increasing x. At x=0.3, the band gap energy is 2.5 eV.

For example, simulations for $Ga_{1-x}N_{1-x}Zn_xO_x$ solid solutions by first-principles calculations reveal a downward-bowing composition dependence of band gap energy, with the minimum reached when the ZnO content is around 60%. Extrapolation of these simulation results to experimental data yields a minimum band gap energy of 2.29 eV at x=0.525.

$Ga_{1-x}N_{1-x}Zn_xO_x$ solid solutions have narrower forbidden bands than pure GaN and ZnO. This is because (N 2p)-(Zn 4s, 4p) bonding occurs near the top of the valence band of $Ga_{1-x}N_{1-x}Zn_xO_x$ solid solutions newly. A narrower forbidden band results in a higher efficiency of solar energy utilization. For example, simply preparing a solid solution of GaN and ZnO may result in a limited reduction in forbidden band width. Accordingly, there may be provided a narrow-forbidden-band photoexcitable material that allows for efficient utilization of light energy, a photochemical electrode including such a photoexcitable material, and a method for manufacturing such a photoexcitable material.

A photoexcitable material may be a solid solution of MN (where M is at least one of gallium, aluminum and indium) and ZnO. The photoexcitable material may contain ZnO in an amount of 30 to 70 mol %, more than 30 to 70 mol %, or 40 to 60 mol %. A ZnO content of less than 30 mol % or more than 70 mol % may fail to provide a band gap energy of 2.20 eV or less. The photoexcitable material may have a band gap energy of 2.20 eV or less, 1.90 to 2.20 eV, 1.90 to 2.10 eV, or 1.95 to 2.00 eV. Gallium, aluminum, and indium share the common feature of being a group 13 element. The term "photoexcitable material" refers to a material that is excited upon absorbing light.

The photoexcitable material may be represented by formula (1):

$$M_{1.00-x}N_{1.00-x}Zn_xO_x \quad \text{formula (1)}$$

where $0.30 \le x \le 0.70$, $0.30 < x \le 0.70$, or $0.40 \le x \le 0.60$ may be satisfied.

The photoexcitable material may be layered. An average thickness of the layer of the layered photoexcitable material has no limit specially and may be selected suitably depending on the purpose. For example, the layer of the photoexcitable material may have an average thickness of 0.5 to 5 μm.

GaN-ZnO-based materials are solid solutions having a hexagonal Wurtzite-type crystal structure. The composition of these solid solutions varies continuously as gallium and zinc are replaced with each other and nitrogen and oxygen are replaced with each other. GaN-ZnO solid solutions have a narrower band gap than simple GaN material and simple ZnO material. As more ZnO is dissolved in GaN, the end of absorption wavelengths may extend to longer wavelengths.

For example, the forbidden band of $Ga_{1-x}N_{1-x}Zn_xO_x$ solid solutions is narrowest when x is about 0.5, at which the forbidden band width (band gap energy) is about 2.5 eV. In the solar spectrum, radiation with photon energies of 2.5 eV or more accounts for only 20% of the total energy radiation. Accordingly, the efficiency of solar energy utilization may be enhanced by further reducing the forbidden band width of $Ga_{1-x}N_{1-x}Zn_xO_x$.

For example, a solid solution of MN (where M is at least one of gallium, aluminum and indium) and ZnO may be deposited by nanoparticle deposition (NPD) to obtain a photoexcitable material having a very small band gap energy. For example, the NPD process disclosed in Documents 1 to 3 below may be used. NPD allows a film of a highly crystalline ceramic nanoparticle assembly to be formed at low temperatures without the use of resin components.

Document 1: Imanaka, Y., Amada, H. & Kumasaka, F., "Dielectric and Insulating Properties of Embedded Capacitor for Flexible Electronics Prepared by Aerosol-Type Nanoparticle Deposition", *Jpn. J. Appl. Phys.*, 52, 05DA02 (2013)

Document 2: Imanaka, Y. et al., "Nanoparticulated Dense and Stress-Free Ceramic Thick Film for Material Integration", *Adv. Eng. Mater.*, 15, 1129-1135 (2013)

Document 3: Imanaka, Y., Amada, H., Kumasaka, F., Awaji, N. & Kumamoto, A., "Nanoparticulate $BaTiO_3$ Film Produced by Aerosol-Type Nanoparticle Deposition", *J. Nanopart. Res.*, 18, 102 (2016)

For example, the band gap energy may be 2.5 eV. For example, the band gap energy may be 2.29 eV. For example, there may be provided an $M_{1.00-x}N_{1.00-x}Zn_xO_x$ solid solution having a band gap energy of 2.20 eV or less and a method for preparing such a solid solution.

A photoexcitable material may be prepared by NPD as follows.

NPD may be performed by the process disclosed in Documents 1 to 3. An NPD process involves ejecting an aerosol in which the particles are dispersed in a gas from a nozzle onto a substrate, the aerosol collides against the substrate and a film including the feedstock particles is formed on the substrate.

An inorganic film is formed by NPD. In a system continuously evacuated with a vacuum pump, inorganic feedstock particles form an aerosol with a gas stream and are carried. The carried feedstock particles collide with each other in the nozzle and are crushed. In the feedstock particles, the crystallinity of the interior of the feedstock particles is maintained while part of the crystal structure of the surface of the feedstock particles is distorted, and, thus, the surface energy level of the feedstock particles increases. When the crushed feedstock particles are deposited on the substrate, the crushed feedstock particles are recombined together by an action (cohesive force) in which the high-energy-level, unstable surface of the feedstock particles is stabilized. As a result, a dense film of a nanoparticle assembly is formed on the substrate at room temperature. If the film is annealed, the optimum sintering temperature is reduced by at least 500° C. since the interior of the film is composed of nanoparticles.

For example, if a GaN-ZnO-based material is deposited by NPD at a high particle flow velocity, the resulting film has a significantly smaller band gap energy than the GaN-ZnO-based materials corresponding to feedstock.

The GaN-ZnO-based materials corresponding to feedstock particles ($Ga_{1.00-x}N_{1.00-x}Zn_xO_x$ solid solution) are prepared, for example, by a solid-state reaction of oxide feedstocks ($Ga_2O_3$ and ZnO) at an elevated temperature, for example, 1,123 K (about 850° C.), in an ammonia gas stream. This method of preparing the feedstock particles may involve the following phenomenon. When $Ga_2O_3$ and ZnO react to form a solid solution, $ZnGa_2O_4$ forms readily as a by-product. Once $ZnGa_2O_4$ forms, a reaction of the GaN-ZnO-based material may not proceed even when $ZnGa_2O_4$ is made react in an ammonia gas stream.

Accordingly, for example, in a method for manufacturing feedstock particles (GaN-ZnO-based material ($Ga_{1.00-x}N_{1.00-x}Zn_xO_x$ solid solution)), serving as a photoexcitable material, by reacting a mixture of GaN and ZnO, a generation of impurities such as $ZnGa_2O_4$ is reduced and a solid solution of GaN and ZnO is obtained.

A method for manufacturing a photoexcitable material includes heating a mixture of MN (where M is at least one of gallium, aluminum and indium) and ZnO to form a solid solution of MN and ZnO.

The photoexcitable material may be used as feedstock particles for the manufacture of a photoexcitable material having a band gap energy of 2.20 eV or less.

A heating temperature for heating the mixture has no limit, may be selected suitably depending on the purpose, may be, for example, 500° C. to 900° C., and may be, for example, 600° C. to 850° C. When the heating temperature is within a preferred range, unreacted residues and the generation of impurities may be reduced more effectively.

The mixture may be heated in an inert atmosphere or ammonia atmosphere. The inert atmosphere may be, for example, argon or nitrogen.

An amount of ZnO regarding the solid solution has no limit and is selected suitably depending on the purpose. For example, a solid solution containing 30 to 70 mol % ZnO may be used as feedstock particles for the manufacture of a photoexcitable material having a band gap energy of 2.20 eV or less.

A mixing proportion of MN and ZnO in the mixture has no limit and may be selected suitably depending on the purpose. For example, ZnO, which may volatilize during heating, may be present in an amount larger than the proportion of ZnO to MN in the solid solution to obtain a solid solution having the desired composition.

A photochemical electrode includes at least a conductive layer and a layered photoexcitable material (which may hereinafter be referred to as "photoexcitable material layer") and may optionally include other components.

The conductive layer may be a layer with conductivity and a shape, a size and a structure of the conductive layer have no limit and may be selected suitably depending on the purpose. Examples of materials for the conductive layer include metals and metal oxides. Examples of metals include silver (Ag), gold (Au), copper (Cu), platinum (Pt), palladium (Pd), tungsten (W), nickel (Ni), tantalum (Ta), bismuth (Bi), lead (Pb), indium (In), tin (Sn), zinc (Zn), titanium (Ti), and aluminum (Al). Examples of metal oxides include tin-doped indium oxide (ITO), fluorine-doped tin oxide (FTO), antimony-doped tin oxide (ATO), zinc oxide, indium oxide ($In_2O_3$), aluminum-doped zinc oxide (AZO), gallium-doped zinc oxide (GZO), tin oxide, zinc oxide-tin oxide-based materials, indium oxide-tin oxide-based materials, and zinc oxide-indium oxide-magnesium oxide-based materials.

If the conductive layer is a thin film, it may be supported on a support. The support may be, for example, a glass substrate.

The photoexcitable material layer is a layered photoexcitable material. For example, as described above, the photoexcitable material layer may be formed by NPD.

An average thickness of the photoexcitable material layer has no limit and may be selected suitably depending on the purpose, for example, 0.5 to 5 μm.

FIG. 1 is an example sectional view of a photochemical electrode. The photochemical electrode in FIG. 1 includes a conductive layer 1 and a photoexcitable material layer 2 on the conductive layer 1. The conductive layer 1 may be supported on a support such as a glass substrate.

The photochemical electrode may be used as an anode for light-dependent reactions of artificial photosynthesis. A carbon dioxide reduction apparatus used for artificial photosynthesis includes, in sequence, the photochemical electrode, serving as an anode, a proton-permeable membrane, and a cathode and may optionally include other components.

In band gap energy measurements and evaluations, reflectance is measured for each wavelength using a UV-visible spectrophotometer (V-650) available from JASCO Corporation. After the measurement, the band gap energy is calculated by the following procedure. The measured reflectance is substituted into Kubelka-Munk function (1):

$$F(R_\infty) = \frac{(1-R_\infty)^2}{2R_\infty} \quad (1)$$

where $F(R_\infty)$: Kubelka-Munk function
$R_\infty$: absolute reflectance

A graph of $(h\nu\alpha)^{(1/n)}$ on the vertical axis against energy ($h\nu$) on the horizontal axis is then obtained from equation (2) below. The intersection of the gradient (gradient at an inflection point of the graph) and the baseline is calculated. The band gap energy is defined as the value at the intersection on the horizontal axis.

$$(h\nu\alpha)^{\frac{1}{n}} = A(h\nu - Eg) \quad (2)$$

where h: Planck constant
ν: frequency
$h\nu = 1239.7/\lambda$ (λ: wavelength)
α: absorption coefficient (replaced with $F(R_\infty)$)
Eg: band gap energy
A: proportionality constant
n: 1/2 for direct transition and 2 for indirect transition A three-electrode electrochemical cell is used for measurements. The working electrode is a specimen (having an area of 0.75 cm²) deposited on an FTO substrate. The counter electrode is a platinum foil. The reference electrode is a Ag/AgCl (saturated aqueous KCl solution) electrode. The electrolyte is a 0.5 M $Na_2SO_4$ aqueous solution (pH=6.0 to 6.5) which is bubbled with nitrogen gas for 30 minutes in advance to remove dissolved oxygen. The potential is corrected, when appropriate, with a reference value of the normal hydrogen electrode at pH=0 (vs. NHE), and the corrected potential is presented. A photocurrent density-potential curve is measured by sweeping the potential from −0.4 V to 1.6 V while intermittently exposing the specimen to AM 1.5 G artificial sunlight (at 100 mW/cm²).

MANUFACTURING EXAMPLE 1

GaN and ZnO are mixed such that the molar ratio of GaN to ZnO in the resulting solid solution is 55:45. The mixture is reacted at 1,123 K (about 850° C.) in an ammonia gas stream for 12 hours to obtain a $Ga_{0.55}N_{0.55}Zn_{0.45}O_{0.45}$ solid solution powder having an average particle size of 1 μm.

MANUFACTURING EXAMPLE 2

$Ga_2O_3$ and ZnO are mixed such that the molar ratio of GaN to ZnO in the resulting solid solution is 55:45. The mixture is reacted at 1,123 K (about 850° C.) in an ammonia gas stream for 12 hours to obtain a $Ga_{0.55}N_{0.55}Zn_{0.45}O_{0.45}$ solid solution powder having an average particle size of 1 μm.

Figure 2:
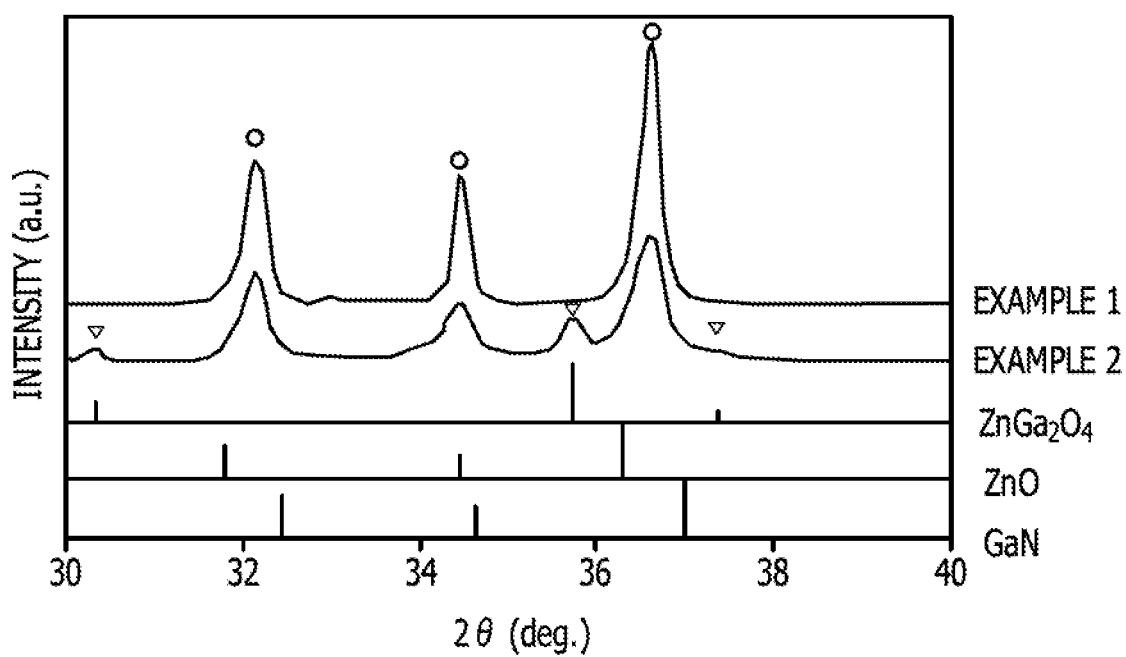
FIG. 2 illustrates example X-ray diffraction spectra of solid solution powders.

FIG. 2 illustrates example X-ray diffraction spectra of the solid solution powders. The solid solution powders obtained in Manufacturing Examples 1 and 2 are analyzed by X-ray diffraction. The results are illustrated in FIG. 2. FIG. 2 depicts diffraction peaks for simple GaN, simple ZnO, and $ZnGa_2O_4$. The solid solution powder obtained in Example 2 exhibits diffraction peaks attributed to GaN and ZnO (indicated by the circles) and diffraction peaks attributed to $ZnGa_2O_4$ (indicated by the inverted triangles). The solid solution powder obtained in Example 1 exhibits diffraction peaks attributed to GaN and ZnO (indicated by the circles) but no diffraction peaks attributed to $ZnGa_2O_4$. Thus, the method of manufacture in Manufacturing Example 1 produces smaller amounts of impurities than the method of manufacture in Manufacturing Example 2.

MANUFACTURING EXAMPLE 3

GaN and ZnO are mixed in predetermined amounts. The mixtures are reacted at 1,123 K (about 850° C.) in an ammonia gas stream to obtain $Ga_{1.00-x}N_{1.00-x}Zn_xO_x$ feedstock powders having a purity of 99.9% or more and an average particle size of 1 μm. Table 1 lists the compositions and band gap energies of the resulting feedstock powders ($Ga_{1.00-x}N_{1.00-x}Zn_xO_x$).

TABLE 1

| Composition formula | x | Band gap energy (eV) |
| --- | --- | --- |
| GaN | 0.00 | 3.04 |
| $Ga_{0.90}N_{0.90}Zn_{0.10}O_{0.10}$ | 0.10 | 2.81 |
| $Ga_{0.76}N_{0.76}Zn_{0.24}O_{0.24}$ | 0.24 | 2.59 |
| $Ga_{0.69}N_{0.69}Zn_{0.31}O_{0.31}$ | 0.31 | 2.54 |
| $Ga_{0.55}N_{0.55}Zn_{0.45}O_{0.45}$ | 0.45 | 2.53 |
| ZnO | 1.00 | 3.23 |

The nanoparticle deposition (NPD) apparatus used includes an aerosol generator system, a deposition chamber, and a vacuum system. The deposition unit may include no heat source. Each $Ga_{1.00-x}N_{1.00-x}Zn_xO_x$ feedstock powder manufactured in Manufacturing Example 3 and having a purity of 99.9% or more and an average particle size of 1 μm is placed in a vessel of the aerosol generator system and is subjected to vibrations at 10 Hz. A helium gas having a pressure of 0.2 MPa and a purity of 99.9% is then introduced into the vessel to generate an aerosol. The resulting aerosol is fed to a nozzle in the deposition chamber. The internal pressure of the deposition chamber is controlled to less than 10 Pa by a mechanical booster and a vacuum pump. The aerosol is ejected from the nozzle and collides onto an FTO substrate (glass substrate having a fluorine-doped tin oxide thin film formed thereon) placed in the deposition chamber for 10 minutes. The gas flow velocity during this process is 50 to 100 m/sec. The gas flow velocity is calculated from the flow rate of the gas passing through the nozzle orifice. As a result, a $Ga_{1-x}N_{1-x}Zn_xO_x$ photoexcitable material layer (having an average thickness of 3 μm) is formed on the FTO substrate at room temperature. After the deposition, the photoexcitable material layer is annealed at 600° C. in a nitrogen atmosphere for 30 minutes to restore crystallinity. In this way, photoexcitable material layers are formed on FTO substrates to obtain photochemical electrodes.

The band gap energies of the photoexcitable material layers of the resulting photochemical electrodes are determined, as listed in Table 2.

TABLE 2

| Composition formula | x | Band gap energy (eV) |
|---|---|---|
| GaN | 0.00 | 2.92 |
| $Ga_{0.76}N_{0.76}Zn_{0.24}O_{0.24}$ | 0.24 | 2.35 |
| $Ga_{0.69}N_{0.69}Zn_{0.31}O_{0.31}$ | 0.31 | 2.18 |
| $Ga_{0.55}N_{0.55}Zn_{0.45}O_{0.45}$ | 0.45 | 1.95 |
| ZnO | 1.00 | 3.06 |

Of the resulting photochemical electrodes, the photochemical electrode manufactured using a $Ga_{0.55}N_{0.55}Zn_{0.45}O_{0.45}$ solid solution as a feedstock powder is tested for photocurrent. This photochemical electrode is found to produce a very large photocurrent, for example, 600 μA/cm².

Figure 3:
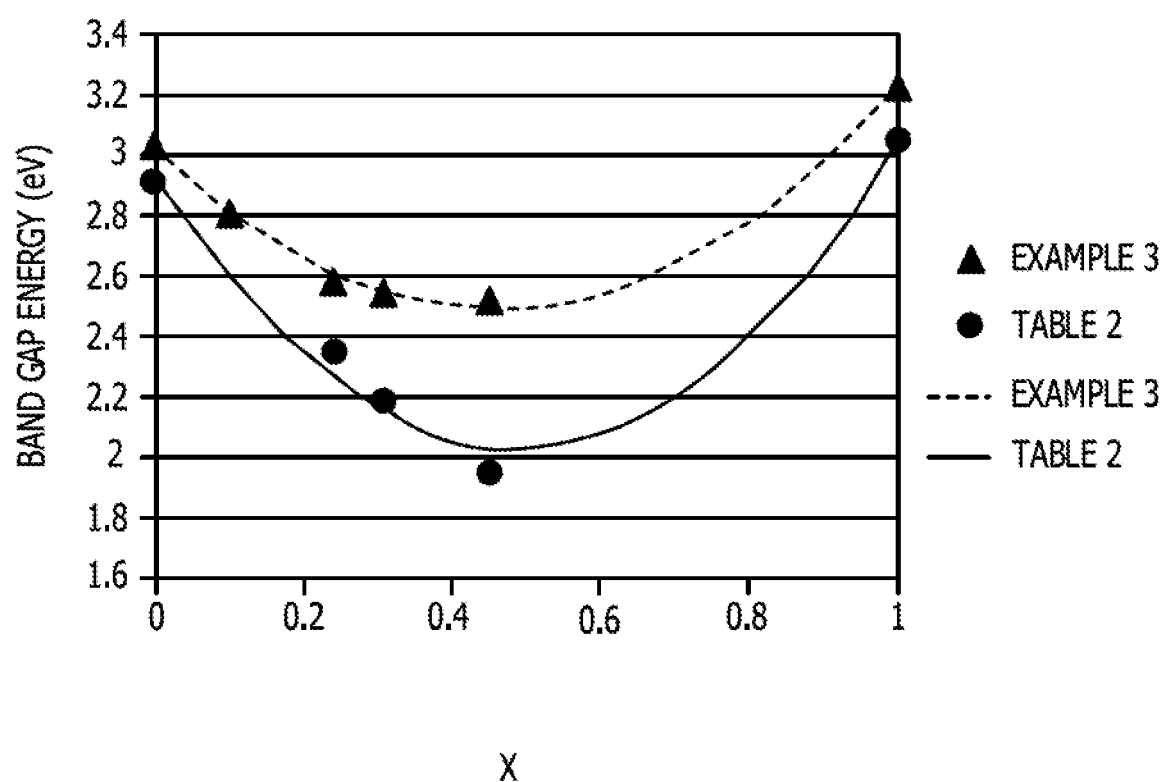
FIG. 3 illustrates example relationships between composition and band gap energy of $Ga_{1.00-x}N_{1.00-x}Zn_xO_x$. 

FIG. 3 illustrates example relationships between composition and band gap energy of $Ga_{1.00-x}N_{1.00-x}Zn_xO_x$. FIG. 3 depicts the band gap energies of the $Ga_{1.00-x}N_{1.00-x}Zn_xO_x$ solid solutions obtained in Manufacturing Example 3 and the band gap energies of the photoexcitable material layers of the photochemical electrodes listed in Table 2. Quadratic polynomial fitting curves obtained from these results are added to FIG. 3. A band gap energy in a photoexcitable material layer ($Ga_{1.00-x}N_{1.00-x}Zn_xO_x$ solid solution) of a photochemical electrode is 2.20 eV or less in a range of 30 to 70 mol % of ZnO content and light energy may be utilized with high efficiency.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A method for manufacturing a photoexcitable material, comprising:
   carrying particles, which form an aerosol, of a solid solution of MN (where M is at least one of gallium, aluminum and indium) and ZnO with a gas stream in a system evacuated with a vacuum pump; and
   forming a photoexcitable material layer including the particles on a substrate or a conductive layer by ejecting, from a nozzle, the aerosol of the particles which are collided with each other in the nozzle onto the substrate or the conductive layer in such a manner that the particles are recombined together by an action in which surfaces of the particles which have high-enemy-level by a collision are stabilized when the particles are deposited on the substrate or the conductive layer.

2. The method according to claim 1, wherein the photoexcitable material contains 30 to 70 mol % ZnO and has a band gap energy of 2.20 eV or less.

3. The method according to claim 1, further comprising annealing the photoexcitable material layer.

4. The method according to claim 3, wherein the annealing comprises annealing the photoexcitable material layer at 600° C. to 850° C.

5. The method according to claim 3, wherein the annealing comprises annealing the photoexcitable material layer in an ammonia atmosphere.

* * * * *